(12) United States Patent
Guo et al.

(10) Patent No.: US 10,978,520 B2
(45) Date of Patent: Apr. 13, 2021

(54) DISPLAY DEVICE

(71) Applicant: WuHan TianMa Micro-electronics Co., Ltd., Wuhan (CN)

(72) Inventors: Linshan Guo, Wuhan (CN); Zhonghuan Cao, Wuhan (CN); Peng Shen, Wuhan (CN); Jun Yan, Wuhan (CN); Zaiwu Feng, Wuhan (CN)

(73) Assignee: WuHan TianMa Micro-electronics CO., LTD., Wuhan (CN)

( * ) Notice: Subject to any disclaimer, the term of this patent is extended or adjusted under 35 U.S.C. 154(b) by 0 days.

(21) Appl. No.: 16/676,634

(22) Filed: Nov. 7, 2019

(65) Prior Publication Data

US 2020/0411596 A1 Dec. 31, 2020

(30) Foreign Application Priority Data

Jun. 27, 2019 (CN) .......................... 201910567687.X

(51) Int. Cl.
*G06F 3/041* (2006.01)
*H01L 27/32* (2006.01)
(Continued)

(52) U.S. Cl.
CPC .......... *H01L 27/323* (2013.01); *G06F 3/0445* (2019.05); *G09G 3/3225* (2013.01); *H01L 27/3246* (2013.01); *H01L 27/3258* (2013.01); *H01L 51/5253* (2013.01); *G06F 2203/04102* (2013.01); *G09G 2300/0426* (2013.01); *G09G 2380/02* (2013.01)

(58) Field of Classification Search
None
See application file for complete search history.

(56) References Cited

U.S. PATENT DOCUMENTS

2017/0110480 A1* 4/2017 Zhang ................... H01L 27/124
2018/0348913 A1 12/2018 Lee et al.
(Continued)

FOREIGN PATENT DOCUMENTS

| CN | 105304644 A | 2/2016 |
| CN | 106775173 A | 5/2017 |

(Continued)

OTHER PUBLICATIONS

First Office Action dated Jan. 26, 2021 in Chinese Application No. 201910567687A, filed Jun. 27, 2019, 13 pages.

*Primary Examiner* — Joseph R Haley
(74) *Attorney, Agent, or Firm* — Christensen O'Connor Johnson Kindness PLLC

(57) ABSTRACT

The present disclosure provides a display device, including: an organic encapsulation layer, an area enclosed by a boundary of the organic encapsulation layer being a first area; and a first dam surrounding the display area, a second area being arranged between the first area and the first dam. A first touch lead is arranged in the second area, and a first protrusion is arranged between the first touch lead and the substrate. For the display device provided by the present disclosure, an actual width of the first touch lead is larger than a width of its projection onto the substrate. In a case of occupying a same bottom area, a resistance of the first touch lead in the present disclosure is greatly reduced, which greatly improves driving ability of the IC.

16 Claims, 9 Drawing Sheets

(51) Int. Cl.
*G06F 3/044* (2006.01)
*G09G 3/3225* (2016.01)
*H01L 51/52* (2006.01)

(56) References Cited

U.S. PATENT DOCUMENTS

2019/0334120 A1\* 10/2019 Seo .................... H01L 51/5246
2020/0167038 A1\* 5/2020 Lee ...................... G06F 3/0443

FOREIGN PATENT DOCUMENTS

| CN | 106816457 A | 6/2017 |
| CN | 108874256 A | 11/2018 |
| CN | 108984016 A | 12/2018 |

\* cited by examiner

DISPLAY DEVICE

CROSS-REFERENCE TO RELATED APPLICATIONS

The present disclosure claims priority under 35 U.S.C. § 119 to Chinese Patent Application No. 201910567687.X, filed on Jun. 27, 2019, the content of which is incorporated herein by reference in its entirety.

TECHNICAL FIELD

The present disclosure relates to the technical field of display technologies, and in particular, to a display device.

BACKGROUND

The display technology has developed very rapidly since its emergence, such as a cathode ray tube technology (CRT), a plasma display technology (PDP), a liquid crystal display technology (LCD), and the latest organic light-emitting display technology (OLED) and micro diode display technology (micro LED).

Unlike a traditional flat panel display device, a display panel can achieve flexible display with a flexible material as a substrate, thereby creating a fantastic visual effect. The flexible display panel can be applied into various fields due to its flexibility, such as a rollable display device, a flexible wearable device, a foldable display device, and the like.

In a flexible display screen provided by the related art, a touch function is integrated on a thin film encapsulation layer. However, due to integration of the touch function, the number of driving lines is greatly increased compared with a display panel that simply performs displaying. Increase of lines requires for the thinner foldable screen and brings the higher requirement on a driving circuits (IC).

SUMMARY

In view of this, an embodiment of the present discloses a display device, and the display device has a display area and a non-display area. The display device includes: a substrate; a driving circuit layer arranged on the substrate; a light-emitting device layer arranged on the driving circuit layer, the light-emitting device layer including: an organic light-emitting diode including a first electrode, a light-emitting layer and a second electrode arranged on the driving circuit layer; and a pixel definition layer including an aperture exposing the first electrode; a thin film encapsulation layer arranged on the light-emitting device layer, the thin film encapsulation layer including: a first inorganic encapsulation layer, an organic encapsulation layer, and a second inorganic encapsulation layer, wherein an area enclosed by a boundary of the organic encapsulation layer is a first area; a touch sensing unit arranged on the thin film encapsulation layer, the touch sensing unit including a touch insulation layer and a second touch metal layer; and a first dam surrounding the display area. A second area is arranged between the first area and the first dam, a first touch lead is arranged in the second area, and a first protrusion is arranged between the first touch lead and the substrate.

DESCRIPTION OF EMBODIMENTS

In order to make the purposes, features and advantages of the present disclosure more understandable, the present disclosure will be further described with reference to the accompanying drawings and embodiments.

It is to be noted that details are set forth in the following description in order to better illustrate the present disclosure. The present disclosure is therefore not limited by the embodiments disclosed in the following.

Figure 1:
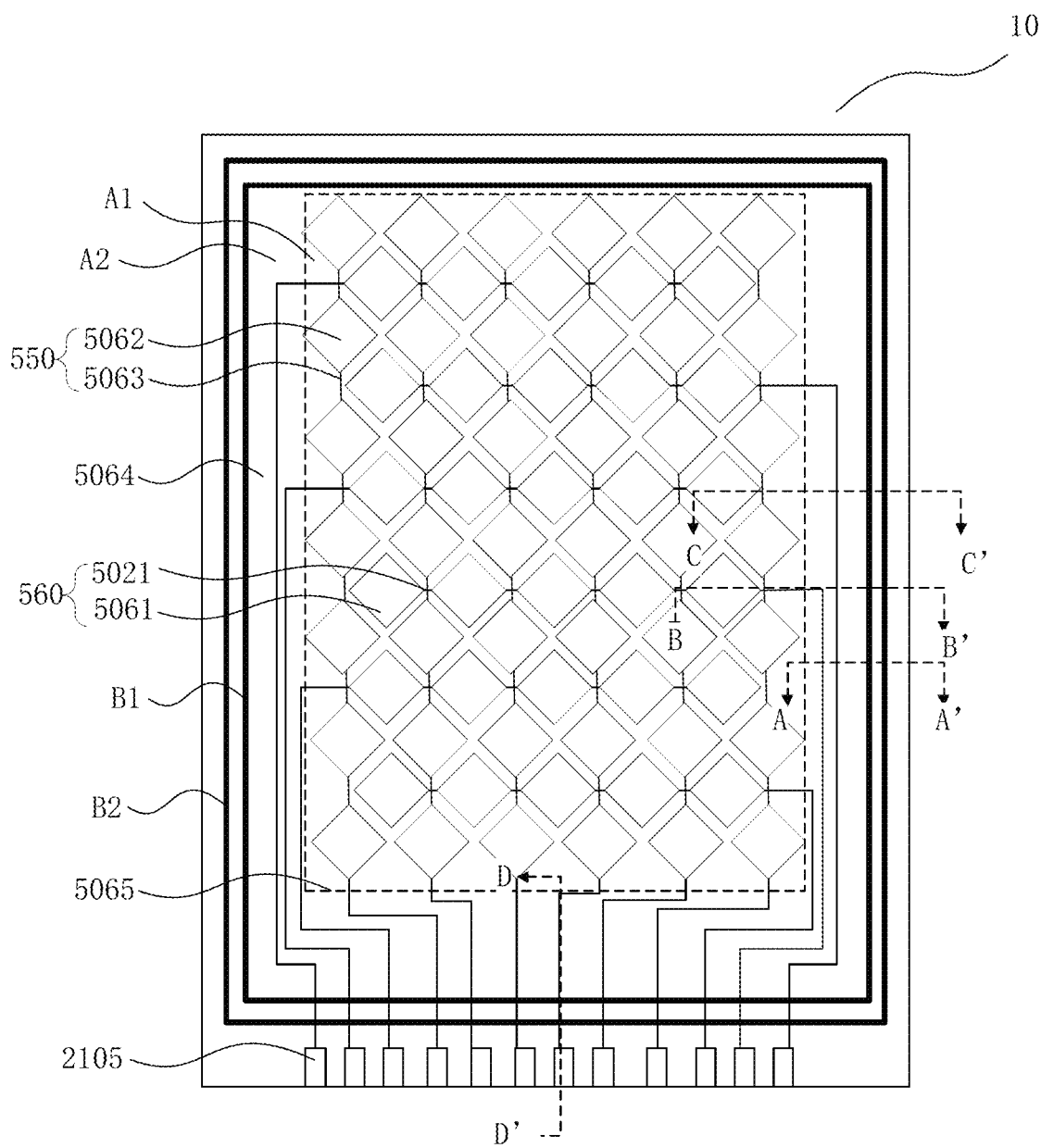
FIG. 1 is a schematic top view of a structure of a display device according to an embodiment of the present disclosure.
Figure 2:
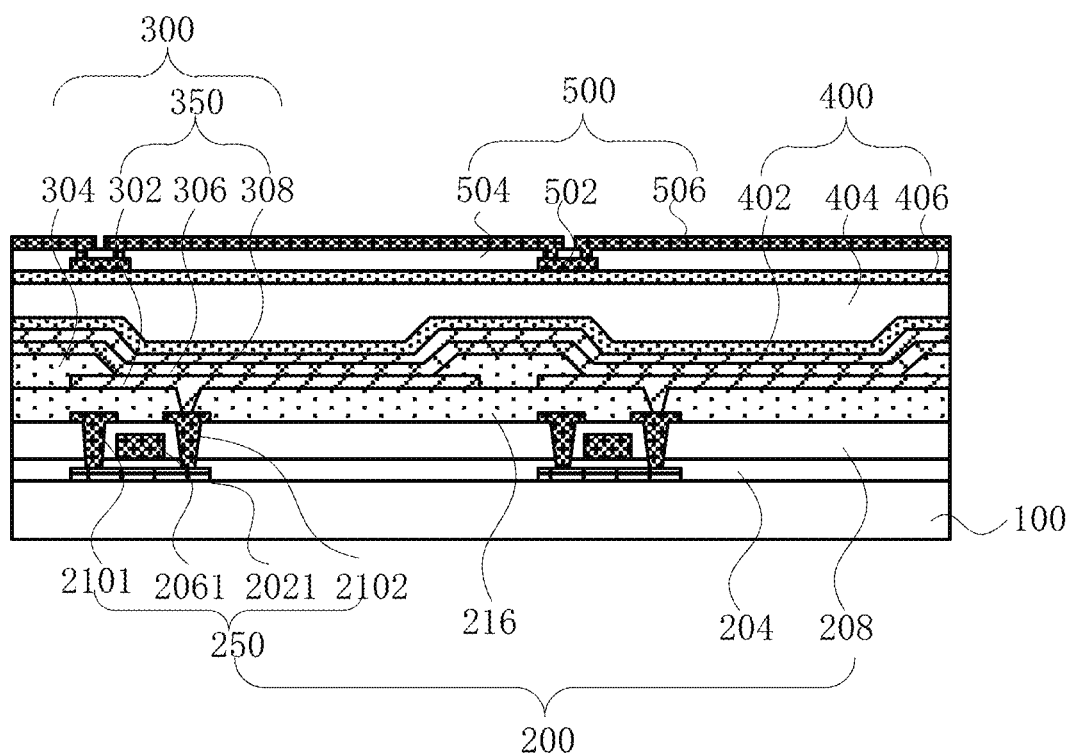
FIG. 2 is a cross-sectional view of a structure of a display area of the display device of FIG. 1.

FIG. 1 is a schematic top view of a structure of a display device according to an embodiment of the present disclosure, and FIG. 2 is a cross-sectional view of a structure of a display area of the display device of FIG. 1. With reference to FIG. 1 and FIG. 2, the display device has a display area and a non-display area. The display area is provided with pixel units arranged in a matrix, which can achieve light-emitting and display under control of a driving chip. The display area is positioned at a center position of the entire display device, and the non-display area surrounds the display area. The display device 10 includes a substrate 100, a driving circuit layer 200, a light-emitting device layer 300, a thin film encapsulation layer 400, and a touch sensing unit 500. The driving circuit layer 200 is arranged on the substrate 100. The light-emitting device layer 300 may be arranged on the driving circuit layer 200, and the light-emitting device layer includes a plurality of organic light-emitting diodes. Further, the organic light-emitting diode includes a first electrode 302, a light-emitting layer 306 and a second electrode 308. The organic light-emitting diode further includes a pixel definition layer 304. The pixel definition layer 304 includes an aperture exposing the first electrode 302. The thin film encapsulation layer 400 is arranged on the light-emitting device layer 300 and includes a first inorganic encapsulation layer 402, an organic encapsulation layer 404 and a second inorganic encapsulation layer 406 that are stacked. The touch sensing unit 500 is arranged on the thin film encapsulation layer 400 and includes a first touch metal layer 502, a touch insulation layer 504 and a second touch metal layer 506. In other embodiments of the present disclosure, a protective layer can be further arranged on the touch sensing unit 500.

The substrate 100 can be a flexible substrate and can include plastic. For example, the substrate 100 may include polyethersulfone (PES), polyacrylate (PAR), polyetherimide (PEI), polyethylene naphthalate (PEN), polyethylene terephthalate (PET), polyphenylene sulfide (PPS), polyallyl ester, polyimide (PI), polycarbonate (PC), cellulose triacetate (TAC) or cellulose acetate propionate (CAP), but embodiments of the present disclosure are not limited thereto.

The display device 10 may be a bottom emission display device, or the display device 10 may be a top emission display device. When the display device 10 is a bottom emission display device that emits light toward a side of the substrate 100 facing away from the thin film encapsulation layer 400 and displays an image, the substrate 100 can include a transparent material. However, when the display device 10 is a top emission display device that displays an image toward the thin film encapsulation layer 400, the substrate 100 may include a non-transparent material. The substrate 100 may include a flexible non-transparent metal. When the substrate 100 includes a metal, the substrate 100 may include at least one metal material selected from iron, chromium, manganese, nickel, titanium, molybdenum, stainless steel (SUS), and inconel. However, embodiments of the present disclosure are not limited thereto. The substrate 100 may include a metal foil.

The driving circuit layer 200 is formed on the substrate 100, and the driving circuit layer includes a plurality of pixel circuits for driving the light-emitting diodes to emit light. Each pixel circuit includes at least two thin film transistors and one capacitor, e.g., two thin film transistors and one capacitor (2T1C), five thin film transistors and one capacitor (5T1C), or seven thin film transistors and one capacitor (7T1C). The at least two thin film transistors and one capacitor includes one driving transistor, and this driving transistor has a drain electrode electrically connected to an anode of the organic light-emitting diode to control display of the organic light-emitting diode. In order to more clearly illustrate a film layer structure of the present disclosure, two pixels are shown in FIG. 2, and one thin film transistor connected to the organic light-emitting diode is shown for each pixel.

With reference to FIG. 2, a thin film transistor 250 is formed on the substrate 100. The thin film transistor 250 may include an active layer 2021, a gate electrode 2061, a source electrode 2101, and a drain electrode 2102.

The active layer 2021 may include an inorganic semiconductor such as silicon, or the active layer 202 may include an organic semiconductor. The active layer 2021 may include a source region, a drain region, and a channel region. The channel region may be disposed between the source region and the drain region. In an example, when the active layer 2021 includes polysilicon, an amorphous silicon layer may be first formed on substantially an entire surface of the substrate 100, and the resulting structure may be crystallized to form a polysilicon layer. The polysilicon layer may be patterned. The source and drain regions may be doped with impurities, and the source and drain regions may be doped with impurities at an edge of the polysilicon layer. In this way, an active layer 2021 including a source region, a drain region and a channel region disposed between the source region and the drain region is thus formed.

A gate insulation layer 204 is formed on the active layer 2021. The gate insulation layer 204 is configured to insulate the gate electrode 2061 from the active layer 2021. The gate insulation layer 204 may include an inorganic material such as $SiN_x$ or $SiO_2$, however, embodiments of the present disclosure are not limited thereto.

A gate electrode 2061 is formed on a predetermined area of the gate insulation layer 204. The gate electrode 2061 may be connected to a gate line. The gate line can transmit a gate driving signal to the thin film transistor 250. The gate electrode 2061 may include Au, Ag, Cu, Ni, Pt, Pd, Al or Mo or an alloy such as an Al:Nd alloy or a Mo:W alloy. However, embodiments of the present disclosure are not limited thereto, and the gate electrode 2061 may include other various materials as needed. Moreover, in an embodiment of the present disclosure, metal disposed in the same layer as the gate electrode may further include other elements such as a signal driving line located in the non-display area or a light-emitting signal line located in the display area. In an embodiment of the present disclosure, the gate electrode is located in the first metal layer.

An interlayer insulation layer 208 is formed on the gate electrode 206. The interlayer insulation layer 208 can insulate the gate electrode 2061 from the source electrode 2101 and the drain electrode 2102. The interlayer insulation layer 208 may include an inorganic material such as $SiN_x$ or $SiO_2$, embodiments of the present disclosure are not limited thereto.

A source electrode 2101 and a drain electrode 2102 may be formed on the interlayer insulation layer 208. The interlayer insulation layer 208 and the gate insulation layer 204 include through holes exposing source and drain regions of the active layer 2021. The source electrode 2101 and the drain electrode 2102 are respectively in direct contact with the exposed source and drain regions of the active layer 2021 via the through holes.

The source electrode 2101 and the drain electrode 2102 may include at least one or several selected from Al, Pt, Pd, Ag, Mg, Au, Ni, Nd, Ir, Cr, Li, Ca, Mo, Ti, W, and Cu. The source electrode 2101 and the drain electrode 2102 may have a single layer structure or a multilayer structure. Moreover, in an embodiment of the present disclosure, the source electrode and the drain electrode are located in a second metal layer, and metal disposed in the same layer as the source electrode and the drain electrode may further include other elements such as a pin located in the non-display area and a data line and a power signal line located in the display area. The pin can be electrically connected to the data line or other signal line so as to transmit a signal from an external driving circuit to the data line. The data line is electrically connected to the drain electrode, so as to transmit a driving signal from an exterior to the thin film transistor 250.

FIG. 2 shows a top gate type thin film transistor which sequentially includes an active layer 2021, a gate electrode 2061, a source electrode 2101, and a drain electrode 2102. However, embodiments of the present disclosure are not limited thereto. For example, the gate electrode may be disposed under the active layer.

The thin film transistor 250 can be electrically connected to the organic light-emitting diode 350. The thin film transistor 250 transmits a signal to an organic light-emitting device, i.e., the organic light-emitting diode 350, and the signal can be used to drive the organic light-emitting device to perform displaying. The thin film transistor 250 may be covered with a planarization layer 216. In this way, the thin film transistor 250 can be protected from external influences, and the driving circuit layer can have a relatively flat surface, thereby facilitating preparation of subsequent devices.

The planarization layer 216 may include an inorganic insulation layer and/or an organic insulation layer. The inorganic insulation layer may include $SiO_2$, $SiN_x$, SiON, $Al_2O_3$, $TiO_2$, $Ta_2O_5$, $HfO_2$, $ZrO_2$ or BST (Barium Strontium Titanate), however, embodiments of the present disclosure are not limited thereto. When the planarization layer includes an organic insulation layer, the organic insulation layer may include polymethyl methacrylate (PMMA), polystyrene (PS), phenol-based polymeric derivative, acrolein-based polymer, imide-based polymer, aryl ether-based polymer, amid-based polymer, fluorine-based polymer, P-dimethoxybenzene-based polymer, vinyl alcohol-based polymer, or any combination thereof, however, embodiments of the present disclosure are not limited thereto. The planarization layer 216 may have a composite stacking structure, and the composite stacking structure may include an inorganic insulation layer and/or an organic insulation layer. In this embodiment, the planarization layer 216 is illustrated as an organic material.

In some other embodiments of the present disclosure, a first buffer layer may also be disposed between the substrate 100 and the driving circuit layer 200. The first buffer layer can reduce impurities entering the driving circuit layer 200 after penetrating the substrate 100. The first buffer layer can cover, as a whole, the substrate 100 to form a flat surface. Thus, the first buffer layer may include a material capable of forming a flat surface. For example, the first buffer layer may include an inorganic material such as silicon oxide, silicon nitride, silicon oxynitride, aluminum oxide, aluminum nitride, titanium oxide or titanium nitride. The first buffer layer may also include an organic material such as polyimide, polyester or acrylic. The first buffer layer may have a single layer structure or a multilayer structure. When the first buffer layer has a multilayer structure, the multilayer structure may be selected from any combination of above-described inorganic materials or organic materials.

The light-emitting device layer 300 may be formed on the planarization layer 216, that is, on the driving circuit layer 200. The light-emitting device layer includes a plurality of organic light-emitting diodes 350 and a pixel definition layer 304. The organic light-emitting diode 350 includes a first electrode 302, a light-emitting layer 306 and a second electrode 308.

The first electrode 302 is formed on the planarization layer 216, and is electrically connected to the drain electrode 2102 through a through hole on the planarization layer 216 that exposes a portion of the drain electrode 2102. The first electrode 302 may be a reflective electrode, a transmissive electrode or a semi-transmissive electrode. When the first electrode 302 is a reflective electrode, the first electrode 302 may include a reflection layer. The reflection layer includes Ag, Mg, Al, Pt, Pd, Au, Ni, Nd, Ir, Cr, or any combination thereof, however, embodiments of the present disclosure are not limited thereto. When the first electrode 302 is a transmissive electrode or a semi-transmissive electrode, the first electrode 302 may respectively include a transmissive electrode layer or a semi-transmissive electrode layer. The transmissive electrode layer or the semi-transmissive electrode layer may be formed on the reflection layer. The transmissive electrode layer or the semi-transmissive electrode layer may include indium tin oxide (ITO), indium zinc oxide (IZO), zinc oxide (ZnO), indium oxide ($In_2O_3$), indium gallium oxide (IGO) or aluminum zinc oxide (AZO), however, embodiments of the present disclosure are not limited thereto.

The light-emitting layer 306 includes a low molecular weight organic material or a high molecular weight organic material. The light-emitting layer 306 may include at least one of a hole transport layer (HTL), a hole injection layer (HIL), an electron transport layer (ETL), or an electron injection layer (EIL). In the display device 10, the display area is provided with a plurality of first electrodes 302 arranged in an array, and each first electrode 302 corresponds to one light-emitting pixel. The pixel definition layer 304 overlaps with a gap between adjacent first electrodes 302 and partially overlaps with an edge of the first electrode 302. The pixel definition layer 304 has a plurality of apertures exposing a plurality of first electrodes 302, and the light-emitting layer 306 is formed correspondingly to each aperture of the pixel definition layer 304.

The second electrode 308 may be a transmissive electrode or a semi-transmissive electrode, and the second electrode 308 covers a plurality of light-emitting layers 306 and the pixel definition layer 304. The second electrode 308 may include a metal thin film, which may include Li, Ca, LiF/Ca, LiF/Al, Al, Ag, Mg or a compound thereof, and may have a relatively low work function. An auxiliary electrode layer or a bus electrode may be formed on the metal film, and the auxiliary electrode layer or the bus electrode may include a material for forming the transmissive electrode, such as ITO, IZO, ZnO or $In_2O_3$, however, embodiments of the present disclosure are not limited thereto.

The second electrode 308 can transmit light emitted from the light-emitting layer 306. In this case, the display device 10 is a top emission display device. The display device 10 may also be a bottom emission display device, in which light can be emitted from the light-emitting layer towards the substrate 100. In this case, the first electrode 302 may include a transmissive electrode or a semi-transmissive electrode, and the second electrode 308 includes a reflective electrode.

The pixel definition layer 304 includes an insulation material, and the pixel definition layer 304 is disposed on the first electrode 302. The pixel definition layer 304 may include at least one organic insulation material including polyimide, polyamide, acrylic resin, benzocyclobutene or phenolic resin, however, embodiments of the present disclosure are not limited thereto. The pixel definition layer 304 can be formed by spin coating, and the pixel definition layer 304 can expose a predetermined area of the first electrode 302.

The thin film encapsulation layer 400 is formed on the second electrode 308, and the thin film encapsulation layer 400 may include a first inorganic encapsulation layer 402, an organic encapsulation layer 404, and a second inorganic encapsulation layer 406 that are stacked. The thin film encapsulation layer 400 may substantially cover an entire light-emitting device layer 200 and driving circuit layer 100 and expose some necessary connection pins such as a data line pin, a driving signal pin and the like. In some embodiments, the thin film encapsulation layer 400 may substantially cover an entire light-emitting device layer 200 and driving circuit layer 100 and only expose some necessary connection pins such as a data line pin, a driving signal pin and the like. The thin film encapsulation layer 400 can reduce or eliminate penetration of water and oxygen from the exterior into the light-emitting device layer 300. An area of the thin film encapsulation layer 400 may be larger than an area of the light-emitting device layer 300. Therefore, an edge of the thin film encapsulation layer 400 can be in direct contact with the substrate 100 and covers an edge of the light-emitting device layer 300. This can reduce or eliminate penetration of water and oxygen from the exterior.

In this embodiment, the thin film encapsulation layer may include three encapsulation layers, i.e., a first inorganic encapsulation layer 402, an organic encapsulation layer 404, and a second inorganic encapsulation layer 406. In other embodiments of the present disclosure, the thin film encapsulation layer may include n encapsulation layers, where n is an integer equal to or greater than 1. The n encapsulation layers may each include an organic layer and an inorganic layer. The organic layer and the inorganic layer may be sequentially stacked on the light-emitting device layer 300.

The first inorganic encapsulation layer 402 and the second inorganic encapsulation layer 406 may include nitrides, oxides, oxynitrides, nitrates, carbides, or any combination thereof. For example, the first inorganic encapsulation layer 402 and the second inorganic encapsulation layer 406 may include silicon nitride, aluminum nitride, zirconium nitride, titanium nitride, hafnium nitride, tantalum nitride, silicon oxide, aluminum oxide, titanium oxide, tin oxide, cerium oxide, nitric acid silicon, silicon oxynitride or any combination thereof.

The organic encapsulation layer 404 includes, but is not limited to, acrylic, hexamethyldisiloxane, polyacrylates, polycarbonates, polystyrene, and the like for buffering stress of devices during bending, folding, and coverage of particulate contaminants. The organic encapsulation layer 404 may be formed by printing. In order to avoid an uncontrolled area resulting from flowing during printing of the organic encapsulation layer, a printing area may be slightly smaller than an area of the first inorganic encapsulation layer and the second inorganic encapsulation layer. The first inorganic encapsulation layer 402 and the second inorganic encapsulation layer 406 may be larger than the organic encapsulation layer 404. Thus, the first inorganic encapsulation layer 402 and the second inorganic encapsulation layer 406 may be in direct contact with each other at their outer edges. Since the inorganic encapsulation layer has a main function of preventing water and oxygen, and the organic encapsulation layer has a function of absorbing stress and covering the contaminated particles, a structure in which the organic encapsulation layer is completely encapsulated by the inorganic encapsulation layer can further improve an encapsulation effect from a side of the display device 10. This can reduce or eliminate penetration of oxygen or water from the exterior.

Further, since the organic encapsulation layer 404 is formed by inkjet printing, a dam structure can be formed outside the display area, so as to define an outer edge of the organic encapsulation layer 404. The dam structure may be formed by a material of at least one layer located in the same layer as the planarization layer 216, the pixel definition layer 304, and a spacer. In other embodiments of the present disclosure, the dam structure is not a necessary structure, and an edge range of the organic encapsulation layer can be controlled by controlling conditions such as a concentration of the printing material or a position of a nozzle during the inkjet printing process. In this embodiment, an area enclosed by a boundary of the organic encapsulation layer 404 is defined as a first area A1. A position of the first area A1 corresponds to the display area, and an area of the first area. A1 is equal to an area of the display area, or the area of the first area A1 is slightly larger than the area of the display area. That is, in this embodiment, a projection of the display area onto the substrate 100 is within a projection of the first area A1 onto the substrate 100. A first dam B1 and a second dam B2 are disposed around the display area. Here, the dam adjacent to the display area is defined as the first dam B1, and the dam facing away from the display area is defined as the second dam B2. A second area A2 is located between the first area A1 and the first dam B1. The second area A2 is provided with at least a first touch lead 5064.

Each of the first inorganic encapsulation layer 402 and the second inorganic encapsulation layer 406 may have a thickness within a range of approximately 30 nm to 500 nm. In this embodiment, the first inorganic encapsulation layer 402 and the second inorganic encapsulation layer 406 can be formed by first forming a material layer and then thinning. In this way, the display device 10 is further thinned while achieving the encapsulation performance. However, embodiments of the present disclosure are not limited thereto. It is also possible that the first inorganic encapsulation layer 402 and the second inorganic encapsulation layer 406 are formed in a manner in the related art, i.e., by directly forming an inorganic layer without thinning. The first inorganic encapsulation layer 402 and the second inorganic encapsulation layer 406 may have a thickness within in a range of 50 nm to 300 nm. Within this range, the better encapsulation performance and water and oxygen prevention performance can be achieved. The inorganic encapsulation layer after thinning can facilitate improving a bending performance.

The organic encapsulation layer 404 can planarize a height difference. In the film layer under the thin film encapsulation layer 400, the pixel definition layer 304 generates different height differences while forming different pixel apertures, and the organic encapsulation layer 404 can planarize this height difference. The organic encapsulation layer 404 can also reduce stress generated by the first inorganic encapsulation layer 402 and the second inorganic encapsulation layer 406. In a process of manufacturing the display device, after the first inorganic encapsulation layer, there may be residual impurity particles. At this time, the organic encapsulation layer 404 can cover these residual impurities to achieve planarization, thereby preventing these residual impurities from affecting the encapsulation performance.

The organic encapsulation layer 404 may have a thickness within a range of approximately 1 μm to 8 μm. Within this range, the film layer under the organic encapsulation layer 404 can be sufficiently planarized.

In other embodiments of the present disclosure, at least two organic encapsulation layers are provided, and the at least two organic encapsulation layers may have a same thickness or different thicknesses.

According to a representative embodiment of the present disclosure, the organic encapsulation layer 404 may be thicker than the first inorganic encapsulation layer 402 and the second inorganic encapsulation layer 406.

In some other embodiments of the present disclosure, a second buffer layer may also be disposed between the light-emitting device layer 300 and the thin film encapsulation layer 400. The second buffer layer can reduce impurities entering the light-emitting device layer 300 after penetrating the thin film encapsulation layer 400. The second buffer layer may include a material capable of forming a flat surface. For example, the second buffer layer may include an inorganic material such as silicon oxide, silicon nitride, silicon oxynitride, aluminum oxide, aluminum nitride, titanium oxide or titanium nitride. The second buffer layer may also include an organic material such as polyimide, polyester or acrylic. The second buffer layer may have a single layer structure or a multilayer structure. When the second buffer layer has a multilayer structure, the multilayer structure may be selected from any combination of above-described inorganic materials or organic materials. The second buffer layer can be formed by using the same material and process as the first inorganic encapsulation layer 402 and the second inorganic encapsulation layer 406, that is, an entire surface is formed and thinned, and details will not be further described here. A second buffer preparation layer after being thinned may be within a range of 30 nm to 300 nm.

In some other embodiments of the present disclosure, an atomic layer deposition layer may be disposed between the second buffer layer and the first inorganic encapsulation layer. Material is plated one layer by one layer onto a surface of the substrate, i.e., on the second buffer layer, in a monatomic film by atomic layer deposition techniques. In forming the atomic deposition layer, an oxide dielectric layer such as $Al_2O_3$, $TiO_2$, $ZrO_2$, $HfO_2$, $Ta_2O_5$, $Nb_2O_5$, $Y_2O_3$, MgO, $CeO_2$, $SiO_2$, $La_2O_3$, $SrTiO_3$, $BaTiO_3$ may be used. Since a chemical reaction of a new atomic film layer is directly associated with a previous layer during atomic layer deposition, when the finally resulting display device includes an atomic layer deposition layer, the second buffer layer is preferably LiF so as to match a lattice of the atomic layer deposition layer.

In some other embodiments of the present disclosure, the thin film encapsulation layer may include only a second buffer layer, an atomic layer deposition layer, and a first inorganic thin film encapsulation layer, and does not include an organic encapsulation layer or a second inorganic thin film encapsulation layer.

The touch sensing unit 500 is formed on the thin film encapsulation layer 400. The touch sensing unit 500 may be an electrostatic capacitance type touch screen. With reference to FIG. 1 and FIG. 2, the touch sensing unit 500 includes first touch electrodes 550 and second touch electrodes 560. The first touch electrodes 550 are insulated from and intersect with the second touch electrodes 560. When a finger touches the touch sensing unit, an electrostatic capacitance between the first touch electrode 550 and the second touch electrode 560 at a touch position may be changed. When a change in electrostatic capacity is detected, the touch position can be calculated. The touch sensing unit will be described in more details in the following with reference to FIG. 1 to FIG. 3 according to a representative embodiment of the present disclosure. Here, FIG. 3 is a schematic enlarged view illustrating a touch electrode structure of FIG. 1.

Figure 3:
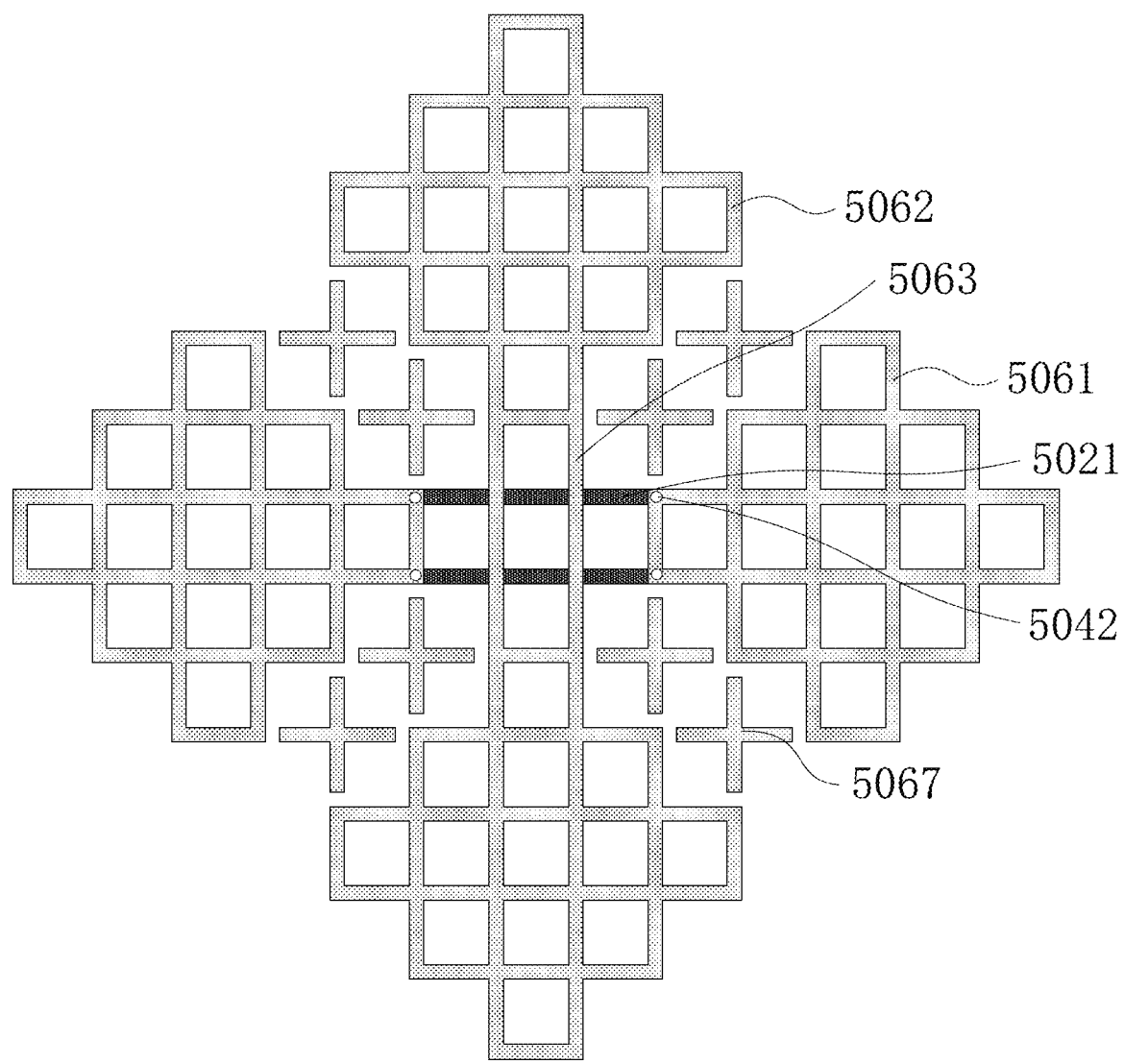
FIG. 3 is a schematic enlarged view of a touch electrode structure of FIG. 1.

With reference to FIG. 1 to FIG. 3, the touch sensing unit includes a first touch metal layer 502, and the first touch metal layer 502 includes a plurality of first connection portions 5021. The touch sensing unit 500 further includes a second touch metal layer 506, and the second touch metal layer 506 includes a plurality of first touch electrode blocks 5061, a plurality of second touch electrode blocks 5062, a plurality of second connection portions 5063, a plurality of first touch leads 5064, a plurality of second touch leads 5065, a plurality of touch pins 5066, and a plurality of redundant electrodes 5067. A touch insulation layer 504 is further disposed between the first touch metal layer 502 and the second touch metal layer 506. The touch insulation layer 504 has a plurality of first through holes exposing a part of the first connection portions 5021.

Multiple first touch electrode blocks 5061 arranged in a first direction are electrically connected to the first connection portions 5021 via the first through holes, so as to form the first touch electrodes 550. The first touch electrodes extend in the first direction and are arranged in a second direction. Multiple second touch electrode blocks 5062 arranged in the second direction are electrically connected to each other via the second connection portions 5063 located in the same layer as the second touch electrode blocks, so as to form the second touch electrode 560. The second touch electrodes extend in the second direction and are arranged in the first direction. The first touch electrode 550 is connected to the touch pin through the first touch lead 5064, and the second touch electrode 560 is connected to the touch pin 2105 through the second touch lead 5065. The touch pin 2105 is located in the second touch metal layer. In some other embodiments of the present disclosure, it is also possible that the touch pin is located in the first metal layer, the third metal layer, the first touch metal layer, or the second touch metal layer.

Each of the first touch electrode block 5061 and the second touch electrode block 5062 is formed as a grid structure, and the grid structure corresponds to the pixel definition layer 304. That is, in a direction perpendicular to the substrate 100, grid metal lines of the first touch electrode block 5061 and the second touch electrode block 5062 are within a projection of the pixel definition layer. A hollow area of the metal grid can expose the organic light-emitting layer, so that the metal grid does not block the display.

The first touch electrode 550 is electrically insulated from the second touch electrode 560. According to a representative embodiment of the present disclosure, a direction in which the first touch electrode 550 extends is substantially perpendicular to a direction in which the second touch electrode 560 extends.

A redundant electrode 5067 may be provided between the first touch electrode 550 and the second touch electrode 560 that are adjacent to each other, and the redundant electrode can also have a metal line structure or a grid structure. A position of the redundant electrode 5067 corresponds to that of the pixel definition layer 304, that is, in the direction perpendicular to the substrate 100, the grid metal line of the redundant electrode 5067 is located within a projection of the pixel definition layer.

The first touch electrode block 5061, the second touch electrode block 5062, and the redundant electrode each include a plurality of metal lines, and the metal lines may include at least one selected from copper, aluminum, molybdenum and silver, which may have relatively high conductivity. When each of the first touch electrode block 5061 and the second touch electrode block 5062 is formed in a grid pattern, flexibility of the first touch electrode 550 and the second touch electrode 560 can be increased. Therefore, when the touch sensing unit 500 is bent to have a relatively small curvature, cracks occurring at the first touch electrodes 550 and second touch electrodes 560 can be reduced or eliminated.

Due to the grid pattern, the first touch electrodes 550 and second touch electrodes 560 may have relatively high light transmittance. Therefore, the first touch electrodes 550 and second touch electrode 560, compared with a transmissive electrode such as ITO, can have a relatively high conductivity due to metal. Therefore, a change in electrostatic capacitance can be transferred to the driving circuit quickly, which can increase a response rate of the touch sensing unit 500.

The touch insulation layer 504 is provided between the first touch metal layer 502 and the second touch metal layer 506, and the touch insulation layer has first through holes exposing a part of the first connection portions 5021. The first connection portion 5021 is electrically connected to the first touch electrode block 5061 through the first through hole. The touch insulation layer may be made of an inorganic material, which may include at least one selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride, however, embodiments of the present disclosure are not limited thereto.

In some embodiments of the present disclosure, the first touch metal layer may be located at a side of the touch insulation layer close to the substrate 100. In other embodiments of the present disclosure, the first touch metal layer may also be located at a side of the touch insulation layer facing away from the substrate 100. That is, in some other embodiments of the present disclosure, the first touch electrode blocks 5061, the second touch electrode blocks 5062, the second connection portions 5063, the first touch leads 5064, the second touch leads 5065, and the touch pins 5066, and the redundant electrodes 5067 are located at the side of the touch insulation layer close to the substrate 100, and the first connection portions 5021 are located at the side of the touch insulation layer 504 facing away from the substrate 100. In some embodiments, only the first connection portions 5021 are located at the side of the touch insulation layer 504 facing away from the substrate 100. In some other embodiments of the present disclosure, it is possible that the first touch electrode blocks and the first connection portions are located at one side of the touch insulation layer while the second touch electrode blocks and the second connection portions are located at the other side of the touch insulation layer. Then, the first touch electrode block can be directly connected to the first connection portion, and the second touch electrode block can be directly connected to the second connection portion. In this case, the through holes of the touch insulation layer can be omitted.

In some other embodiments of the present disclosure, a third buffer layer may also be disposed between thin film encapsulation layer 400 and the touch sensing unit 500. The third buffer layer may be directly formed on the second inorganic encapsulation layer 406 of the thin film encapsulation layer 400, and can replace an adhesion layer between a touch substrate and a display substrate in the related art, thereby reducing a thickness of the display device 10. The third buffer layer may include a material capable of forming a flat surface. For example, the third buffer layer may include an inorganic material such as silicon oxide, silicon nitride, silicon oxynitride, aluminum oxide, aluminum nitride, titanium oxide or titanium nitride. The third buffer layer may also include an organic material such as polyimide, polyester or acrylic. The third buffer layer may have a single layer structure or a multilayer structure. When the third buffer layer has a multilayer structure, the multilayer structure may be selected from any combination of above-described inorganic materials or organic materials. The third buffer layer may be directly formed on the thin film encapsulation layer by vapor deposition.

A protective layer may be further provided on the touch sensing unit. The protective layer covers the touch sensing unit 500, so as to prevent the first touch electrodes 550, the second touch electrodes 560, the first touch lead and the second touch lead from being exposed to the exterior. The protective layer may include an organic material or an inorganic material. When the protective layer is an inorganic material, the inorganic material may include at least one material selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride, however, embodiments of the present disclosure are not limited thereto. When the protective layer is an organic material, it may include at least one material selected from acrylic-based resin, methacrylic resin, polyisoprene, vinyl resin, epoxylite carbamate resin, polydimethylsiloxane, polyimide, acrylic ester, polyethylene terephthalate, polyethylene naphthalate, and cellulosic resin. However, embodiments of the present disclosure are not limited thereto.

In some embodiments of the present disclosure, a spacer layer may be further disposed on the pixel definition layer 216. The spacer layer is formed with a spacer column between respective pixels in the display area. The spacer column is used to support a mask during an evaporation process, and the spacer layer may be made of an organic material.

Figure 4:
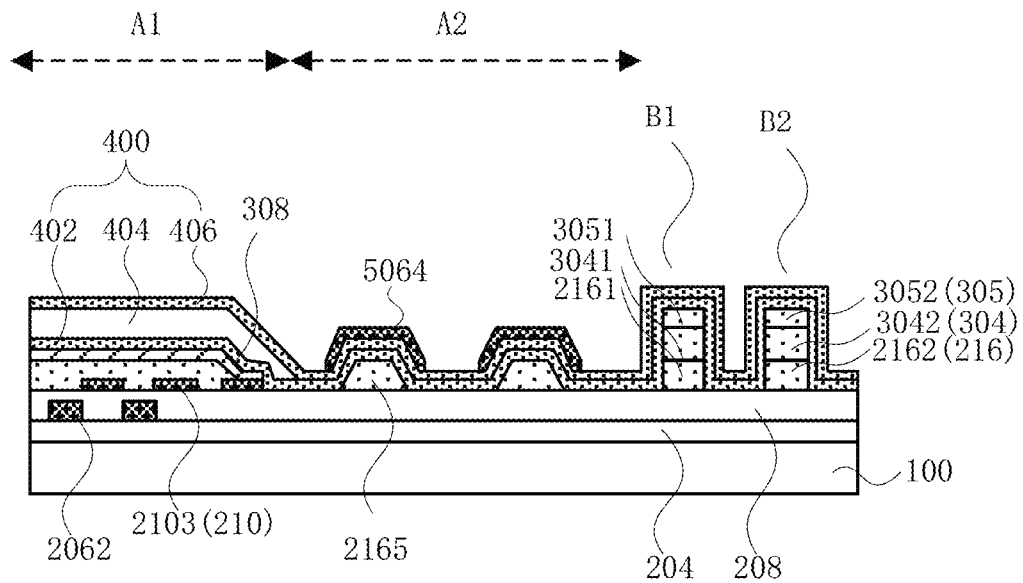
FIG. 4 is a cross-sectional view of a structure taken along AA' of FIG. 1.

FIG. 4 is a cross-sectional view of a structure taken along AA' of FIG. 1. With reference to FIG. 4, in an embodiment of the present disclosure, a second area A2 is formed between the first area A1 and the first dam B1, and the second area A2 is provided with at least a first touch lead 5064. A first protrusion 2165 is formed between the first touch lead 5064 and the substrate 100. A projection of the first touch lead 5064 onto the substrate 100 covers a projection of the first protrusion 2165 onto the substrate 100. In this embodiment, a cross-sectional structure of the first protrusion 2165 in a plane perpendicular to a direction in which the first touch lead extends has a trapezoidal shape, and the cross-sectional structure has a larger width at a side close to the substrate 100 than another side facing away from the substrate 100. The first touch lead 5064 corresponds to a structure of the first protrusion 2165, and includes a first portion covering a top side and a second portion covering an oblique side. Since the first touch lead includes a second portion corresponding to the oblique side of the first protrusion in addition to the first portion parallel with the substrate 100, an actual width of the first touch lead is a sum of a width of the first portion and a width of the second portion, and the actual width is larger than a width of projection onto the substrate 100. Therefore, compared with the related art in which the first touch lead is disposed in only one plane, a resistance of the first touch lead in this embodiment of the present disclosure is greatly reduced while occupying a same bottom area. In this embodiment, the first protrusion may be made of a material of the same layer as the planarization layer 216. The planarization layer 216 has a thickness of approximately 1 μm. When an inclination angle of the oblique side of the first protrusion is 45° and the projection of the first lead onto the substrate 100 is 7 μm, an actual effective width (a sum of a width of the first portion and a width of the second portion) can be approximately 7.4 μm. In this case, the width is increased by 11.4%, and thus the impedance is reduced by approximately 11%, which can greatly improve driving ability of the IC. When the width of the projection of the first lead onto the substrate 100 is approximately 5 μm, the actual effective width can be approximately 5.8 μm. In this case, the width is increased by 16%, and the impedance is reduced by approximately 15%. On the other hand, when the design of this embodiment is adopted such that the impedance of the first touch lead 5064 is equivalent to the impedance of a design in the related art, an area occupied by the first touch lead can be greatly reduced. In this way, the touch lead area can be narrower, thereby facilitating narrow bezel design.

In this embodiment, the first inorganic encapsulation layer 402 and the second inorganic encapsulation layer 406 are further disposed between the first touch lead 5064 and the first protrusion 2165. Since the first inorganic encapsulation layer and the second inorganic encapsulation layer encapsulate an entire display panel to prevent water and oxygen, an inorganic encapsulation layer is provided on the entire display panel except for the pin area. Since the first inorganic encapsulation layer 402 and the second inorganic encapsulation layer 406 are made of inorganic materials which have thin thicknesses, the first protrusion 2165 can still have a protrusion shape even though the first protrusion 2165 is covered by the inorganic encapsulation layer. The first inorganic encapsulation layer 402 and the second inorganic encapsulation layer 406 also cover the first dam B1 and the second dam B2. In this embodiment, the first dam B1 and the second dam B2 may be made of a material of the same layer as the planarization layer 216, the pixel definition layer 304, and the spacer layer 305. The first dam includes a first sub-layer 2161, a second sub-layer 3041, and a third sub-layer 3051. The second dam B2 includes a fourth sub-layer 2162, a fifth sub-layer 3042, and a sixth sub-layer 3052.

In this embodiment, it is illustrated by taking the first protrusion 2165 and the planarization layer 216 being in a same layer as an example. In other embodiments of the present disclosure, the first protrusion 2165 may be disposed in the same layer as the pixel definition layer 304 or disposed in the same layer as the spacer layer 305, or formed by using two or three layers of the planarization layer 216, the pixel definition layer 304 and the spacer layer 305.

In this embodiment, a first signal lead 2062 located in the first metal layer and a second signal lead 2103 located in the second metal layer 210 are provided in the first area A1. The first signal lead and the second signal lead may be various signal lines such as a gate driving signal line, a clock signal line, a driving signal line, a high-level signal line, and a low-level signal line. The second signal lead 2103 may also be a cathode signal bus, and the second electrode 308 is connected to the cathode signal bus through a hole.

Figure 5:
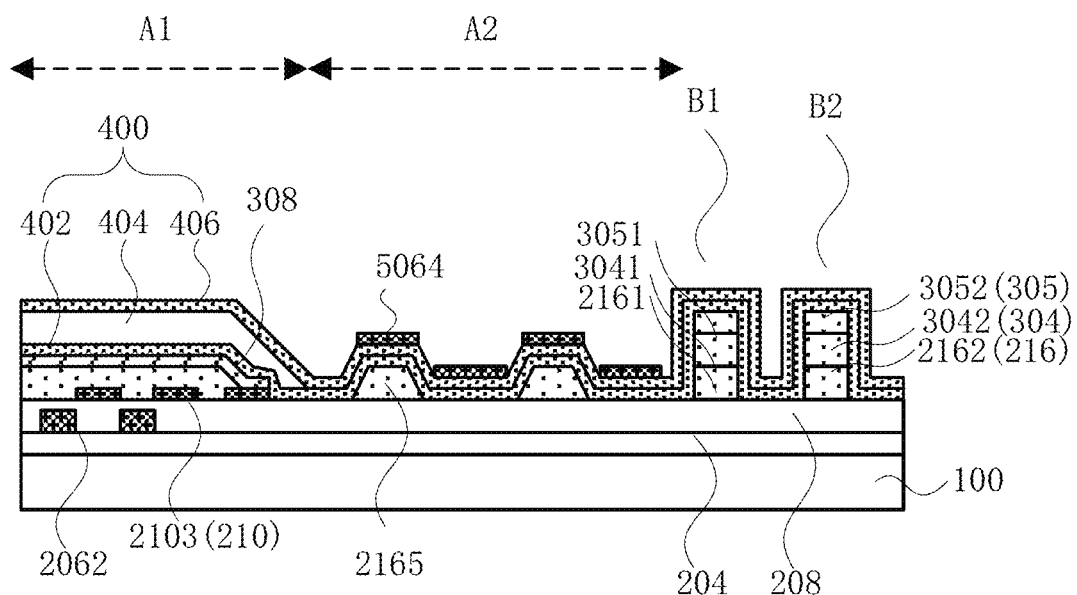
FIG. 5 is a cross-sectional view of another structure taken along AA' of FIG. 1.

FIG. 5 is a cross-sectional view of another structure taken along AA' of FIG. 1. With reference to FIG. 1 and FIG. 5, in an embodiment of the present disclosure, a second area A2 is formed between the first area A1 and the first dam B1, and at least a first touch lead 5064 is provided in the second area A2. A first protrusion 2165 is formed between the first touch lead 5064 and the substrate 100. In this embodiment, a cross-sectional structure of the first protrusion 2165 in a plane perpendicular to a direction in which the first touch lead extends has a trapezoidal shape, and the cross-sectional structure has a larger width at a side close to the substrate 100 than another side facing away from the substrate 100. The first touch lead 5064 is formed on a top surface of the first protrusion and is also provided between two adjacent first protrusions. With the segment difference of the oblique surface of the first protrusion 2165, a distance between two adjacent first touch leads 5064, which are respectively located on a top surface of the first protrusion 2165 and located between first protrusions 2165, then can be increased, so as to make two adjacent first touch leads 5064 be insulated from one another. Therefore, compared with the related art in which the first touch leads are disposed in only one plane, this embodiment of the present disclosure can greatly shorten a horizontal distance (i.e., a distance in a plane parallel with the substrate 100) between two adjacent first touch leads and thus make the touch lead area be narrower, while achieving an equal effective width of the first touch lead.

In this embodiment, the first protrusion may be made of a material of the same layer as the planarization layer 216. The planarization layer 216 has a thickness of approximately 1 μm. When an inclination angle of the oblique side of the first protrusion is 45° and the effective width of the first lead is 7 μm, an average pitch between two adjacent first touch leads 5064 (a pitch in the plane parallel with the substrate) is 8.5 μm. Compared with the related art in which the pitch between two adjacent first touch leads is 13 μm when the touch leads are disposed in only one plane and a distance of 6 μm is required between two adjacent touch leads, this embodiment of the present disclosure can save 40% the touch lead area. On the other hand, when the pitch between two adjacent touch leads in this embodiment is the same as the pitch between two adjacent touch leads in the related art, the first touch lead 5064 in this embodiment can be set as wide as possible, which greatly reduces the impedance.

In this embodiment, the first inorganic encapsulation layer 402 and the second inorganic encapsulation layer 406 are further arranged between the first touch lead 5064 and the first protrusion 2165. The first dam B1 includes a first sub-layer 2161, a second sub-layer 3041, and a third sub-layer 3051. The second dam B2 includes a fourth sub-layer 2162, a fifth sub-layer 3042, and a sixth sub-layer 3052. The first area A1 is further provided with a first signal lead 2062 located in the first metal layer and a second signal lead 2103 located in the second metal layer 210. Same structures of this embodiment as those of the embodiment shown in FIG. 4 will not be further described herein.

Similarly, in other embodiments of the present disclosure, the first protrusion 2165 may be disposed in the same layer as the pixel definition layer 304 or disposed in the same layer as the spacer layer 305, or may be formed by using two or three layers of the planarization layer 216, the pixel definition layer 304 and the spacer layer 305.

Figure 6:
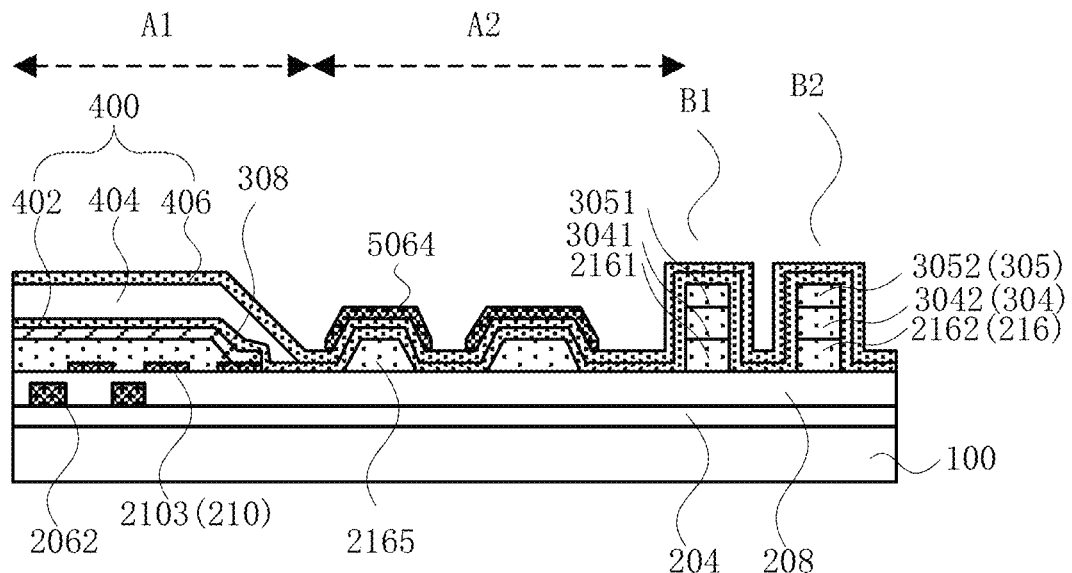
FIG. 6 is a cross-sectional view of still another structure taken along AA' of FIG. 1.

FIG. 6 is a cross-sectional view of still another structure taken along AA' of FIG. 1. With reference to FIG. 1 and FIG. 4, in an embodiment of the present disclosure, a second area A2 is formed between the first area A1 and the first dam B1, and the second area A2 is provided with a first touch lead 5064. A first protrusion 2165 is provided between the first touch lead 5064 and the substrate 100. A projection of the first touch lead 5064 onto the substrate 100 overlaps with a projection of the first protrusion 2165 onto the substrate 100. In this embodiment, a cross-sectional structure of the first protrusion 2165 in a plane perpendicular to a direction in which the first touch lead extends has a trapezoidal shape, and the cross-sectional structure has a larger width at a side close to the substrate 100 than another side facing away from the substrate 100. The first touch lead 5064 corresponds to a structure of the first protrusion 2165, and includes a first portion covering a top surface and a second portion covering an oblique side. Since the first touch lead includes, in addition to the first portion parallel with the substrate 100, the second portion corresponding to the oblique side of the first protrusion, an actual width of the first touch lead is a sum of a width of the first portion and a width of the second portion, and the actual width is larger than a width of projection onto the substrate 100. Therefore, compared with the related art in which the first touch lead is disposed in only one plane, a resistance of the first touch lead in this embodiment of the present disclosure is greatly reduced while occupying a same bottom area.

Further, in this embodiment, a width of a projection of the first protrusion 2165 close to the first dam onto the substrate 100 is larger than a width of a projection of the first protrusion 2165 facing away from the first dam onto the substrate 100. With reference to FIG. 1 and FIG. 6, it can be seen that in order to avoid vertical and horizontal intersecting of the respective first touch leads 5064, the first touch lead 5064 which is close to the first area A1 (i.e., close to the display area) is shorter than the first touch lead 5064 which is away from the display area (i.e., close to the first dam B1).

When the first touch lead 5064 has a determined width and thickness and made of a determined material, the shorter the lead is, the lower the impedance is. Thus, in order to balance the impedances of the first touch leads 5064 having different lengths, the width of the projection the first protrusion 2165 close to the first dam onto the substrate 100 is larger than the width of the projection of the first protrusion 2165 facing away from the first dam onto the substrate 100. That is, the width of the projection of the first protrusion close to the first area onto the substrate 100 is smaller than the width of the projection of the first protrusion facing away from the display area onto the substrate 100. Meanwhile, a width of a projection of the first touch lead 5064 close to the first area onto the substrate 100 is smaller than the width of the projection of the first touch lead 5064 facing away from the display area onto the substrate 100.

Figure 7:
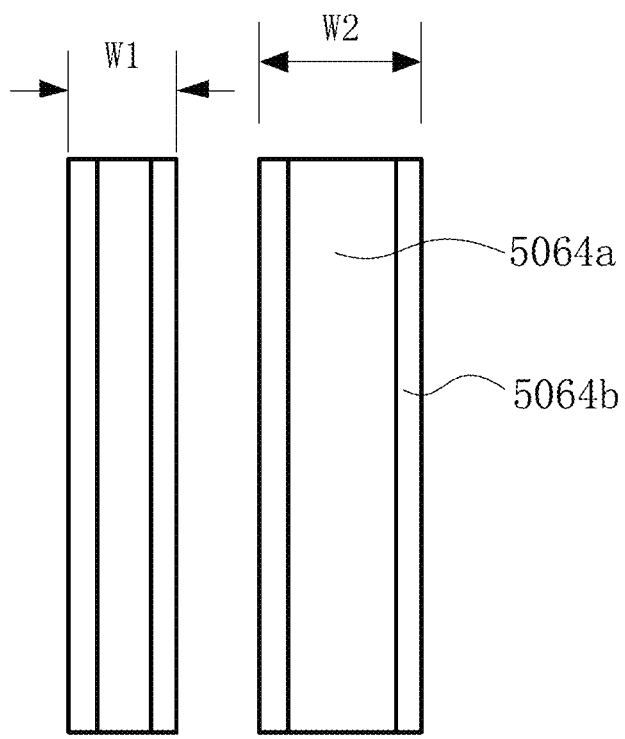
FIG. 7 is a top view of a part of first touch leads of FIG. 6.

FIG. 7 is a top view of a part of the first touch leads of FIG. 6. With reference to FIG. 7, the first touch lead includes a first portion 5064a corresponding to the top surface of the first protrusion and a second portion 5064b corresponding to the oblique surface of the first protrusion. For two adjacent first touch leads, a width of a projection of the first touch lead close to the first area onto the substrate 100 is W1, and a width of a projection of the first touch lead facing away from the first area onto the substrate 100 is W2, where W1<W2. With the first protrusions having different widths (i.e., widths of the first touch leads in a direction perpendicular to extension directions of the first touch leads), impedances for the first touch leads having different lengths then can be balanced.

In this embodiment, the first inorganic encapsulation layer 402 and the second inorganic encapsulation layer 406 are further disposed between the first touch lead 5064 and the first protrusion 2165. The first dam B1 includes a first sub-layer 2161, a second sub-layer 3041, and a third sub-layer 3051. The second dam B2 includes a fourth sub-layer 2162, a fifth sub-layer 3042, and a sixth sub-layer 3052. The first area A1 is provided with a first signal lead 2062 located in the first metal layer and a second signal lead 2103 located in the second metal layer 210. Same structures of this embodiment as those of the embodiment shown in FIG. 4 will not be further described herein.

Similarly, in other embodiments of the present disclosure, the first protrusion 2165 may be disposed in the same layer as the pixel definition layer 304 or disposed in the same layer as the spacer layer 305, or may be formed by using two or three layers of the planarization layer 216, the pixel definition layer 304 and the spacer layer 305.

Figure 8:
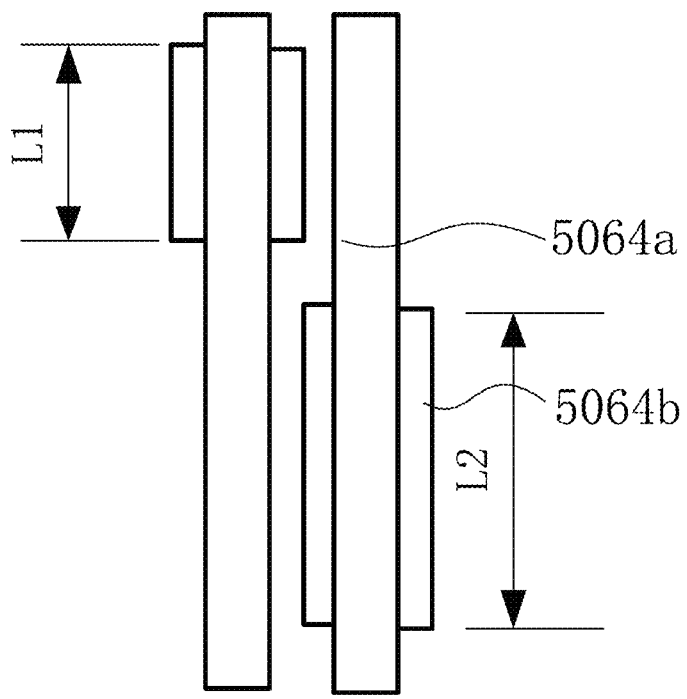
FIG. 8 is another top view of a part of first touch leads of FIG. 6.

In other embodiments of the present disclosure, the impedances of different first touch leads may also be balanced by making the second portions of different first touch leads have different lengths. FIG. 8 is another top view of a part of the first touch leads of FIG. 6. With reference to FIG. 8, the first touch lead located at a left side is a first touch lead close to the first area, and the first touch lead located at a right side is a first touch lead facing away from the first area. The two first touch leads shown in FIG. 8 each include a first portion 5064a corresponding to the top surface of the respective first protrusion. The first touch lead close to the first area includes a second portion corresponding to the oblique surface of the first protrusion, and this second portion has a length of L1 in its extension direction. The first touch lead facing away from the first area includes a second portion 5064b corresponding to the oblique surface of the first protrusion, and this second portion has a length of L2 in its extension direction. Here, L1<L2. In a case where projections of the first portions and the second portions of the two first touch leads onto the substrate have respective same widths, since L1<L2, an impedance per unit length of the first touch lead close to the first area is smaller than an impedance per unit length of the first touch lead facing away from the first area. Since the length of the first touch lead close to the first area is shorter than the length of the first touch lead facing away from the first area, the impedances of the first touch leads having different lengths can be balanced by making the second portions have different lengths. Further, the second portions of adjacent first touch leads can be staggered. As shown in FIG. 8, the second portion of the first touch lead located at the left side and the second portion of the first touch lead located at the right side are staggered. By making the second portions be staggered, a distance between two adjacent first touch leads can be further shortened, thereby facilitating narrow bezel design.

Figure 9:
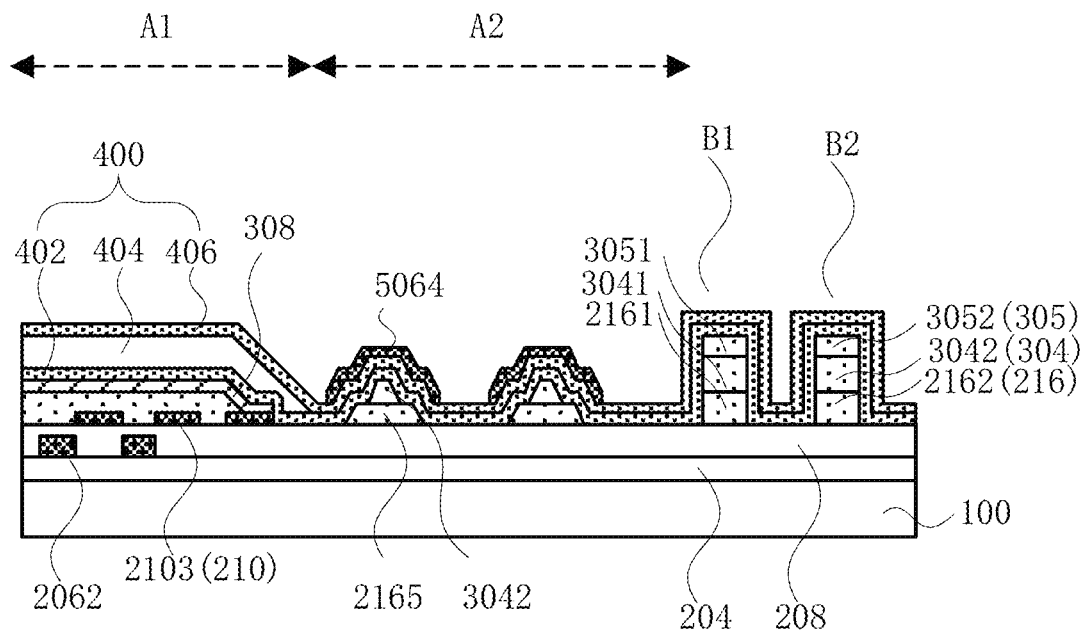
FIG. 9 is a cross-sectional view of yet another structure taken along AA' of FIG. 1.

FIG. 9 is a cross-sectional view of yet another structure taken along AA' of FIG. 1. With reference to FIG. 1 and FIG. 9, in an embodiment of the present disclosure, a second area A2 is formed between the first area A1 and the first dam B1, and the second area A2 is provided with at least a first touch lead 5064. A first protrusion 2165 is provided between the first touch lead 5064 and the substrate 100. A projection of the first touch lead 5064 onto the substrate 100 covers a projection of the first protrusion 2165 onto the substrate 100.

In this embodiment, a second protrusion 3042 is further provided on the first protrusion 2165. The first protrusion 2165 and a second protrusion 3042 are stacked, and a projection of the second protrusion 3042 onto the substrate 100 is within a projection of the first protrusion 2165 onto the substrate 100. Edges of the first protrusion and the second protrusion form a step. A cross-sectional structure of each of the first protrusion 2165 and the second protrusion 3042 in a plane perpendicular to the direction in which the first touch lead extends has a trapezoidal shape, and the cross-sectional structure has a larger width at a side close to the substrate 100 than another side facing away from the substrate 100.

The first touch lead 5064 includes a portion corresponding to the oblique surface of the first protrusion 2165, a portion corresponding to at least a part of the top surface of the first protrusion, a portion corresponding to the oblique surface of the second protrusion 3042, and a portion corresponding to the top surface of the second protrusion 3042. Thus, an actual width of the first touch lead is a sum of widths of respective portions, and the actual width is larger than a width of a projection onto the substrate 100. Therefore, compared with the related art in which the first touch lead is disposed in only one plane, a resistance of the first touch lead in this embodiment of the present disclosure is greatly reduced while occupying a same bottom area. In this embodiment, the first protrusion may be made of a material of the same layer as the planarization layer 216, and the planarization layer 216 has a thickness of approximately 1 μm. The second protrusion may be made of a material of the same layer as the pixel definition layer 304, and the pixel definition layer 304 has a thickness of approximately 1 μm. When an inclination angle of the oblique side of the first protrusion and an inclination angle of the oblique side of the second protrusion are both 45° and the width of the projection of the first lead onto the substrate 100 is 7 μm, an actual effective width (i.e., a sum of a width of the first portion and a width of the second portion) can be approximately 10.6 μm. In this case, the width is increased by 51.4%, and thus the impedance is reduced by approximately 50%, which can greatly improve the driving ability of the IC. When the width of the projection of the first lead onto the substrate 100 is approximately 5 µm, the actual effective width can be approximately 8.6 µm. In this case, the width is increased by 72%, and the impedance is reduced by approximately 70%. On the other hand, when the design of this embodiment is adopted such that the impedance of the first touch lead 5064 is equivalent to the impedance of a design in the related art, an area occupied by the first touch lead can be greatly reduced. In this way, the touch lead can be narrower, which is advantageous for narrow bezel design.

In this embodiment, the first protrusion 2165 and the planarization layer 216 are in a same layer, and the second protrusion 3042 and the pixel definition layer 304 are in a same layer. In some other embodiments of the present disclosure, the first protrusion 2165 and the second protrusion 3041 can be formed by using any two layers of the planarization layer 216, the pixel definition layer 304 and the spacer layer 305. In some other embodiments of the present disclosure, a third protrusion may be formed on the second protrusion. In this case, the first protrusion, the second protrusion and the third protrusion can be formed by respectively using the planarization layer 216, the pixel definition layer 304 and the spacer layer 305.

In this embodiment, the first inorganic encapsulation layer 402 and the second inorganic encapsulation layer 406 are further arranged between the first touch lead 5064 and the first protrusion 2165. The first dam B1 includes a first sub-layer 2161, a second sub-layer 3041, and a third sub-layer 3051. The second dam B2 includes a fourth sub-layer 2162, a fifth sub-layer 3042, and a sixth sub-layer 3052. The first area A1 is further provided with a first signal lead 2062 located in the first metal layer and a second signal lead 2103 located in the second metal layer 210. Same structures of this embodiment as those of the embodiment shown in FIG. 4 will not be further described herein.

Figure 10:
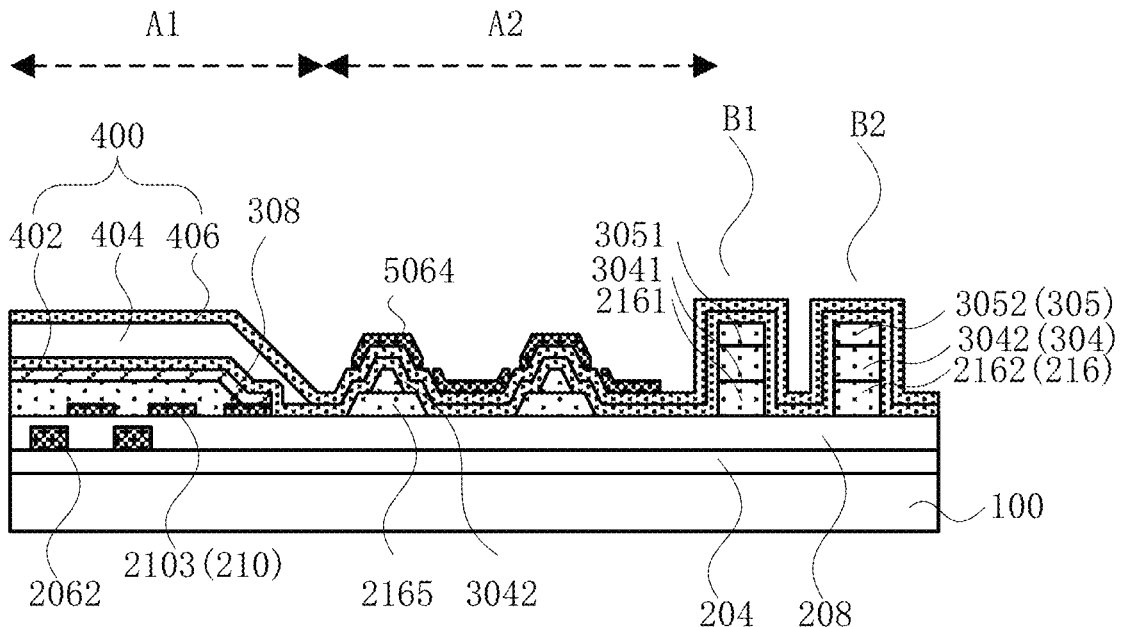
FIG. 10 is a cross-sectional view of yet another structure taken along AA' of FIG. 1.

FIG. 10 is a cross-sectional view of yet another structure taken along AA' of FIG. 1. With reference to FIG. 1 and FIG. 10, in an embodiment of the present disclosure, a second area A2 is formed between the first area A1 and the first dam B1, and the second area A2 is provided with at least a first touch lead 5064. A first protrusion 2165 is provided between the first touch lead 5064 and the substrate 100. A projection of the first touch lead 5064 onto the substrate 100 covers a projection of the first protrusion 2165 onto the substrate 100.

In this embodiment, a second protrusion 3042 is further provided on the first protrusion 2165. The first protrusion 2165 and a second protrusion 3042 are stacked, and a projection of the second protrusion 3042 onto the substrate 100 is within a projection of the first protrusion 2165 onto the substrate 100. Edges of the first protrusion and the second protrusion form a step. A cross-sectional structure of each of the first protrusion 2165 and the second protrusion 3042 in a plane perpendicular to the direction in which the first touch lead extends has a trapezoidal shape, and the cross-sectional structure has a larger width at a side close to the substrate 100 than another side facing away from the substrate 100.

The first touch lead 5064 includes a portion corresponding to the oblique surface of the second protrusion, a portion corresponding to the top surface of the second protrusion, a portion between adjacent first protrusions, and a portion corresponding to the oblique surface of an adjacent first protrusion. With a step difference of the first protrusion 2165 and the second protrusion 3042, two adjacent first touch leads 5064 can be insulated from one another. Therefore, compared with the related art in which the first touch leads are disposed in only one plane, this embodiment of the present disclosure can greatly shorten a horizontal distance (i.e., a distance in a plane parallel with the substrate 100) between two adjacent first touch leads and thus make the touch lead area be narrower, while achieving an equal effective width of the first touch lead.

In addition, a part of the first touch lead 5064 includes a portion between adjacent first protrusions and a portion corresponding to the oblique surfaces of first protrusions, and thus an actual effective width of this part of the first touch lead 5064 is larger than a projection width of this part of the first touch lead 5064 onto the substrate 100. Another part of the first touch lead 5064 includes a portion corresponding to the oblique surface of the second protrusion 3042 and a portion corresponding to the top surface of the second protrusion 3042, and thus an actual effective width of this part of the first touch lead 5064 is larger than a projection width of this part of the first touch lead 5064 onto the substrate 100. Therefore, compared with the related art in which the first touch lead is disposed in only one plane, a resistance of the first touch lead in this embodiment of the present disclosure is greatly reduced while occupying a same bottom area. On the other hand, when the design of this embodiment is adopted such that the impedance of the first touch lead 5064 is equivalent to the impedance of a design in the related art, an area occupied by the first touch lead can be greatly reduced. In this way, the touch lead area can be narrower, which is advantageous for narrow bezel design.

In this embodiment, the first inorganic encapsulation layer 402 and the second inorganic encapsulation layer 406 are further arranged between the first touch lead 5064 and the first protrusion 2165. The first dam B1 includes a first sub-layer 2161, a second sub-layer 3041, and a third sub-layer 3051. The second dam B2 includes a fourth sub-layer 2162, a fifth sub-layer 3042, and a sixth sub-layer 3052. The first area A1 is further provided with a first signal lead 2062 located in the first metal layer and a second signal lead 2103 located in the second metal layer 210. Same structures of this embodiment as those of the embodiment shown in FIG. 4 will not be further described herein.

Figure 11:
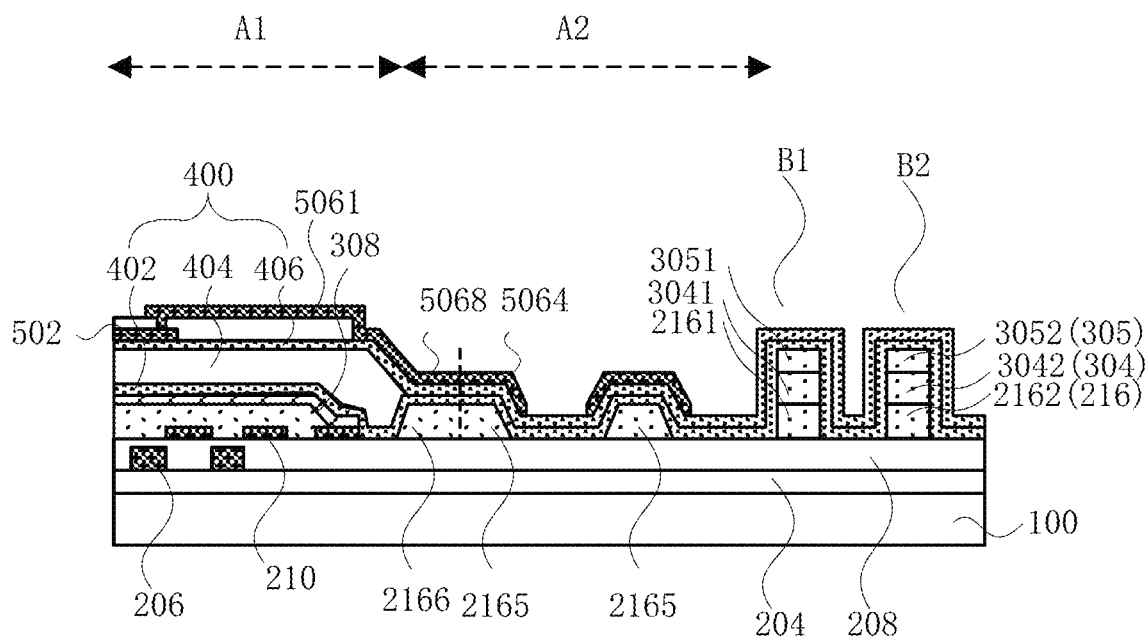
FIG. 11 is a cross-sectional view of a structure taken along BB' of FIG. 1.
Figure 12:
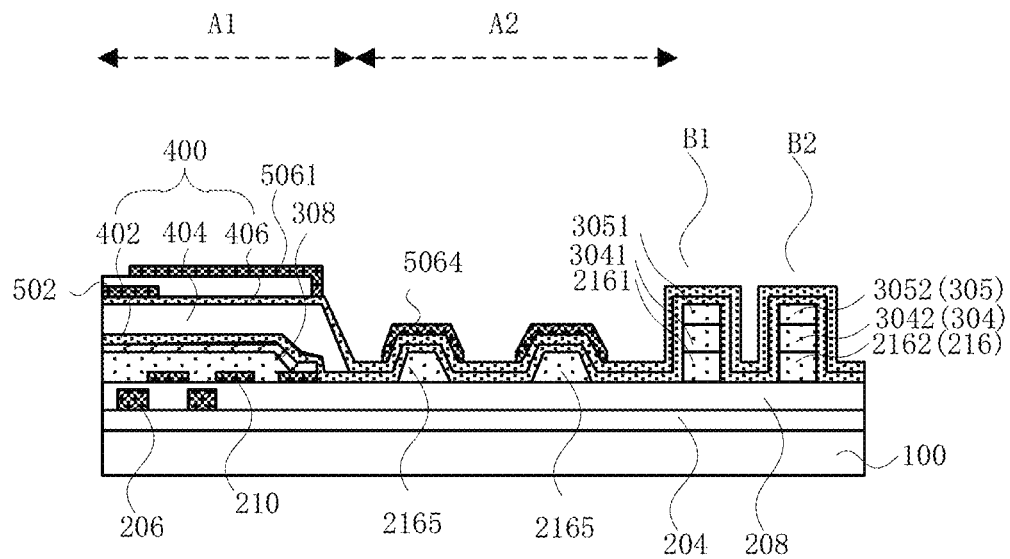
FIG. 12 is a cross-sectional view of a structure taken along CC' of FIG. 1.

FIG. 11 is a cross-sectional view of a structure taken along BB' of FIG. 1, and FIG. 12 is a cross-sectional view of a structure taken along CC' of FIG. 1. With reference to FIG. 11 and FIG. 12, in an embodiment, a fourth protrusion 2166 is further provided, and the fourth protrusion corresponds to a connection line 5068 between the first touch electrode block 5061 and the first touch lead. The first touch lead 5064 is connected to the connection line 5068, and thus in order to clearly show a relationship therebetween, a distinction is made therebetween by using a broken line in FIG. 11. The first touch electrode block 5061 is located in the first area A1. Therefore, at least the gate insulation layer 204, the first metal layer 206, the interlayer insulation layer 208, the second metal layer 210, the planarization layer 216, the second electrode 308, the first inorganic encapsulation layer 402, the organic encapsulation layer 404, the second inorganic encapsulation layer 406, the first touch metal layer 502, and the touch insulation layer are disposed between the first touch electrode block 5061 and the substrate 100. Generally, the gate insulation layer 204, the interlayer insulation layer 208, the first protrusion 2165, the first inorganic encapsulation layer 402 and the second inorganic encapsulation layer 406 are provided between the first touch lead 5064 and the substrate. With reference to FIG. 12, between the first touch lead 5064 and the first area A1, the gate insulation layer 204, the interlayer insulation layer 208, the first inorganic encapsulation layer 402 and the second inorganic encapsulation layer 406 are arranged on the substrate 100. When the first touch electrode block 5061 needs to be connected to the first touch lead, the connection line needs to extend from the first area A1 to an area located between the first touch lead and the first area A1, and then to an area where the first touch lead is located. In this case, the connection line needs to pass multiple step areas and multiple slopes, and thus the connection line may be easily broken. Therefore, in this embodiment, a position corresponding to the first connecting line 5066 is provided with the fourth protrusion 2166. A side of the fourth protrusion 2166 close to the first area A1 coincides with the first area A1, and the fourth protrusion 2166 is connected to the first protrusion 2165. With the fourth protrusion 2166, when the connection line needs to extend from the first area A1 to an area located between the first touch lead and the first area A1, and then to an area where the first touch lead is located, the connection line needs to pass one step area (e.g., only one step area). In this case, the number of steps and a segment difference are greatly reduced, which can greatly reduce a possibility of line breakage and short circuit.

In this embodiment, the fourth protrusion 2166 and the first protrusion 2165 are disposed in a same layer, and the fourth protrusion 2166 is formed by using the planarization layer 216. In other embodiments of the present disclosure, the fourth protrusion may be formed by using at least one of the planarization layer 216, the pixel definition layer 304 and the spacer layer 305. Similarly, in other embodiments, similar to the second protrusion being formed on the first protrusion, a fifth protrusion may be further formed on the fourth protrusion.

Figure 13:
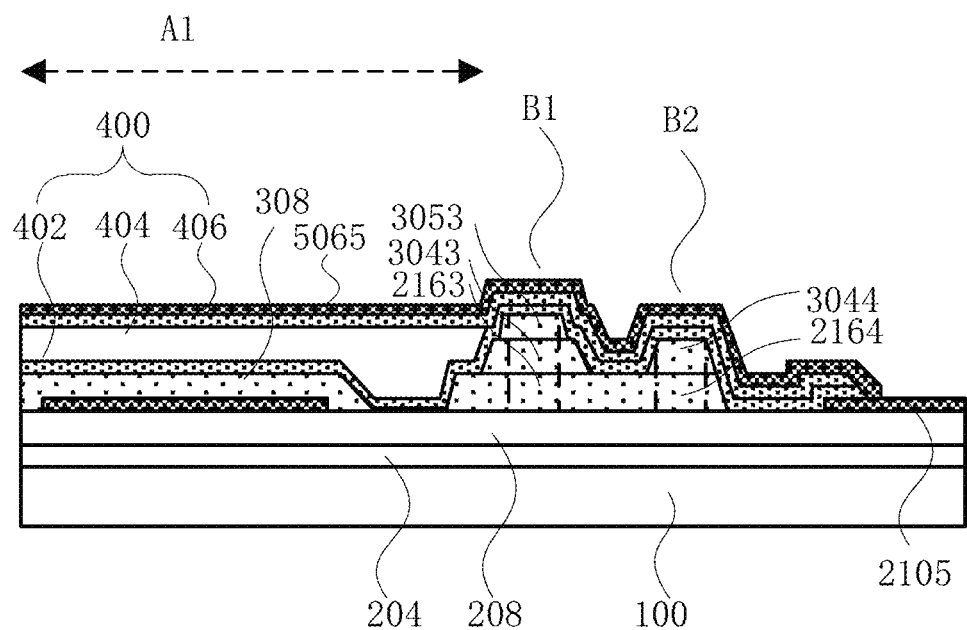
FIG. 13 is a cross-sectional view of a structure taken along DD' of FIG. 1.

FIG. 13 is a cross-sectional view of a structure taken along DD' of FIG. 1. With reference to FIG. 13, in an embodiment, the second touch lead is electrically connected to the touch pin 2105. The second touch lead connects the touch electrode located in the first area with the touch pin 2105 located in the step area of the display panel, therefore, the second touch lead 5065 needs to pass the first dam B1 and the second dam B2. In the related art, the first dam and the second dam are formed independently, i.e., the first dam includes a first sub-layer, a second sub-layer, and a third sub-layer, and the second dam includes a fourth sub-layer, a fifth sub-layer, and a sixth sub-layer. Therefore, in the related art, in a lead-out area of the second touch lead, it is needed to pass a plurality of step areas having a large segment difference. In this case, it is easy to cause a short circuit or disconnection at the step difference. In this embodiment, corresponding to an area where the second touch lead overlaps with the first dam and the second dam, the first dam includes a seventh sub-layer 2163, an eighth sub-layer 3043, and a ninth sub-layer 3053, and the second dam B2 includes a tenth sub-layer 2164 and an eleventh sub-layer 3044. The seventh sub-layer 2163 of the first dam B1 is connected to the tenth sub-layer 2164 of the second dam B2. Further in this embodiment, corresponding to the area where the second touch lead overlaps with the first dam and the second dam, a side of the seventh sub-layer 2163 of the first dam close to the first area A1 overlaps with the first area A1. In this way, a segment difference of the second touch lead 5065 during the lead-out process then can be reduced. Further, a side of the eighth sub-layer 3043 and a side of the ninth sub-layer 3053 of the first dam B1 that are close to the first area coincides with the first area. Therefore, an area where the second touch lead overlaps with the first dam can be further reduced, and the segment difference between the first dam B1 and the first area can be further reduced. Further, in this embodiment, corresponding to the area where the second touch lead overlaps with the first dam and the second dam, a height of the second dam B2 is smaller than a height of the first dam B1. In this embodiment, in the area where the second touch lead overlaps with the first dam and the second dam, the first dam includes three sub-layers, and the second dam includes two sub-layers. The second dam B2 is closer to the touch pin 2105 than the first dam B1. A gate insulation layer 204 and an interlayer insulation layer 208 are usually arranged between the touch pin 2105 and the substrate 100. A height of the touch pin 2105 is smaller than the height of the first dam B1. With the area where the second touch lead overlaps with the first dam and the second dam, the height of the second dam B2 is between the height of the first dam B1 and the height of the touch pin 2105, so that an original step becomes a plurality of small steps. Here, a segment difference between respective steps is smaller than 2 μm, so that a large segment difference can be avoided during a routing process of the second touch lead, thereby further improving reliability of routing of the second touch lead.

Furthermore, compared with the first dam in other areas, a projection of the seventh sub-layer 2163 onto the substrate 100 covers a projection of the eighth sub-layer 3043 onto the substrate 100 in an area where the second touch lead overlaps with the first dam. That is, the seventh sub-layer 2163 is wider than the eighth sub-layer 3043 in the area where the second touch lead overlaps with the first dam. Thereby, a segment difference between the eighth sub-layer and a film layer under the seventh sub-layer changes from one large segment difference in the related art to two small segment differences, thereby reducing a risk of short circuit and disconnection of the second touch lead in this area. Furthermore, the projection of the eighth sub-layer 3043 onto the substrate 100 covers a projection of the ninth sub-layer 3053 onto the substrate 100, that is, the eighth sub-layer 3043 is wider than the ninth sub-layer 3053 in the area where the second touch lead overlaps with the first dam. A projection of the tenth sub-layer 2164 onto the substrate 100 covers a projection of the eleventh sub-layer 3044 onto the substrate 100, that is, the tenth sub-layer 2164 is wider than the eleventh sub-layer 3044 in the area where the second touch lead overlaps with the second dam.

Figure 14:
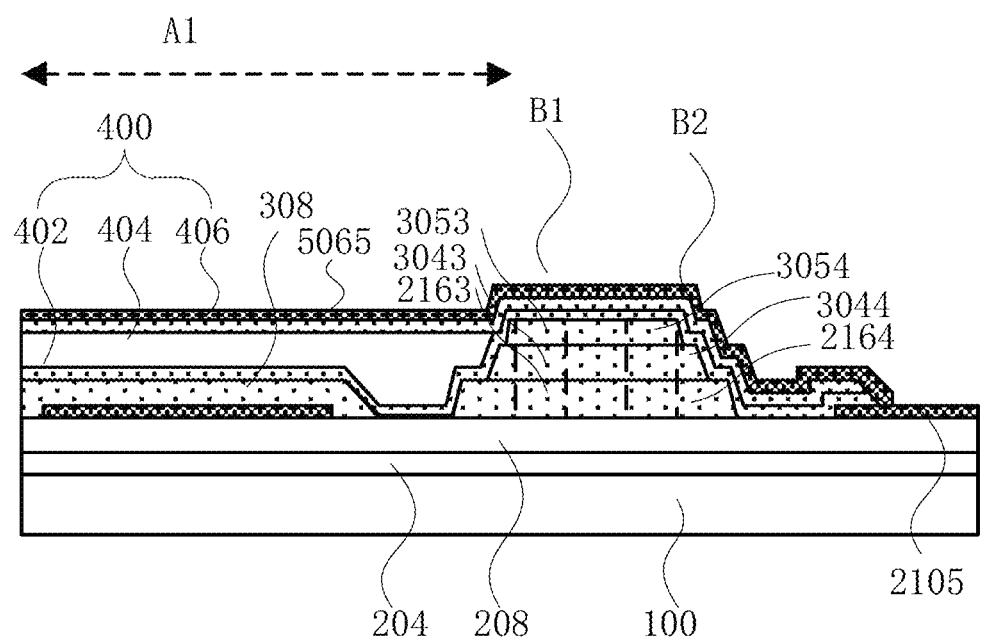
FIG. 14 is a cross-sectional view of another structure taken along DD' of FIG. 1.

FIG. 14 is a cross-sectional view of another structure taken along DD' of FIG. 1. With reference to FIG. 14, in an embodiment, the second touch lead is electrically connected to the touch pin 2105. The second touch lead connects the touch electrode located in the first area with the touch pin 2105 located in the step area of the display panel, therefore, the second touch lead 5065 needs to pass the first dam B1 and the second dam B2. In the related art, the first dam and the second dam are formed independently, i.e., the first dam includes a first sub-layer, a second sub-layer, and a third sub-layer, and the second dam includes a fourth sub-layer, a fifth sub-layer, and a sixth sub-layer. Therefore, in the related art, in a lead-out area of the second touch lead, it is needed to pass a plurality of step areas having a large segment difference. In this case, it is easy to cause a short circuit or disconnection at the segment difference. In this embodiment, corresponding to an area where the second touch lead overlaps with the first dam and the second dam, the first dam includes a seventh sub-layer 2163, an eighth sub-layer 3043, and a ninth sub-layer 3053, and the second dam B2 includes a tenth sub-layer 2164, an eleventh sub-layer 3044, and a twelfth sub-layer 3054. The seventh sub-layer 2163 of the first dam B1 is connected to the tenth sub-layer 2164 of the second dam B2, the eighth sub-layer 3043 of the first dam B1 is connected to the eleventh sub-layer 3044 of the second dam B2, and the ninth sub-layer 3053 of the first dam B1 is connected to the twelfth sub-layer 3054 of the second dam B2. In other words, the first dam B1 and the second dam B2 are formed into on piece in the area where the second touch lead overlaps with the first dam and the second dam, thereby eliminating a segment difference between the first dam B1 and the second dam B2 in the area where the second touch lead overlaps with the first dam and the second dam. Therefore, in this area, the second touch lead can be routed in a plane without passing steps, thereby greatly improving reliability of the second touch lead 5064 in the area where the second touch lead 5064 overlaps with the first dam and the second dam.

Further in this embodiment, corresponding to the area where the second touch lead overlaps with the first dam and the second dam, a side of the seventh sub-layer 2163 of the first dam close to the first area A1 overlaps with the first area A1. In this way, a segment difference of the second touch lead 5065 during the lead-out process then can be reduced. Further, a side of the eighth sub-layer 3043 and a side of the ninth sub-layer 3053 of the first dam B1 that are close to the first area coincides with the first area. Therefore, an area where the second touch lead overlaps with the first dam can be further reduced, and the segment difference between the first dam B1 and the first area can be further reduced.

Furthermore, compared with the first dam in other areas, a projection of the seventh sub-layer 2163 onto the substrate 100 covers a projection of the eighth sub-layer 3043 onto the substrate 100 in the area where the second touch lead overlaps with the first dam. That is, the seventh sub-layer 2163 is wider than the eighth sub-layer 3043 in the area where the second touch lead overlaps with the first dam. Thereby, a segment difference between the eighth sub-layer and a film layer under the seventh sub-layer changes from a large segment difference in the related art to two small segment differences, thereby reducing a risk of short circuit and disconnection of the second touch lead in this area. Furthermore, the projection of the eighth sub-layer 3043 onto the substrate 100 covers a projection of the ninth sub-layer 3053 onto the substrate 100, that is, the eighth sub-layer 3043 is wider than the ninth sub-layer 3053 in the area where the second touch lead overlaps with the first dam. A projection of the tenth sub-layer 2164 onto the substrate 100 covers a projection of the eleventh sub-layer 3044 onto the substrate 100, that is, the tenth sub-layer 2164 is wider than the eleventh sub-layer 3044 in the area where the second touch lead overlaps with the second dam. The projection of the eleventh sub-layer 3044 onto the substrate 100 covers a projection of the twelfth sub-layer 3054 onto the substrate 100, that is, the eleventh sub-layer 3044 is wider than the twelfth sub-layer 3054 in the area where the second touch lead overlaps with the second dam.

The above description is a further detailed description of the present disclosure in connection with preferred embodiments, and shall not be construed as limiting embodiments of the present disclosure. Some simple deductions or substitutions can be made without departing from concept of the present inventive by those skilled in the art, all of which shall fall into the protection scope of the present disclosure.

What is claimed is:

1. A display device having a display area and a non-display area, the display device comprising:
   a substrate;
   a driving circuit layer arranged on the substrate;
   a light-emitting device layer arranged on the driving circuit layer, the light-emitting device layer comprising: an organic light-emitting diode comprising a first electrode, a light-emitting layer and a second electrode arranged on the driving circuit layer; and a pixel definition layer comprising an aperture exposing the first electrode;
   a thin film encapsulation layer arranged on the light-emitting device layer, the thin film encapsulation layer comprising: a first inorganic encapsulation layer, an organic encapsulation layer, and a second inorganic encapsulation layer, wherein an area enclosed by a boundary of the organic encapsulation layer is a first area;
   a touch sensing unit arranged on the thin film encapsulation layer, the touch sensing unit comprising a touch insulation layer and a second touch metal layer; and
   a first dam surrounding the display area,
   wherein the first dam is a dam of the display device closest to the first area, a second area is arranged between the first area and the first dam, a first touch lead is arranged in the second area, and a first protrusion is arranged in the second area and arranged between the first touch lead and the substrate.

2. The display device according to claim 1, further comprising a planarization layer and a spacer layer, wherein the first protrusion is arranged in a same layer as at least one of the planarization layer, the pixel definition layer and the spacer layer.

3. The display device according to claim 1, wherein a projection of the first touch lead onto the substrate covers a projection of the first protrusion onto the substrate.

4. The display device according to claim 3, wherein a cross-sectional structure of the first protrusion in a plane perpendicular to a direction in which the first touch lead extends has a trapezoidal shape, the cross-sectional structure has a larger width at a side close to the substrate than another side facing away from the substrate, and the first touch lead comprises a first portion corresponding to a top side of the cross-sectional structure of the first protrusion and a second portion corresponding to an oblique side of the cross-sectional structure of the first protrusion.

5. The display device according to claim 4, wherein for two adjacent first touch leads, the second portion of one first touch lead close to the first area has a length of L1 in its extension direction, and the second portion of the other first touch lead facing away from the first area has a length of L2 in its extension direction, where L1 is smaller than L2.

6. The display device according to claim 1, wherein for two adjacent first touch leads, a projection of the one first touch lead close to the first area onto the substrate has a width of W1, and a projection of the other first touch lead facing away from the first area onto the substrate has a width of W2, where W1 is smaller than W2.

7. The display device according to claim 1, wherein a cross-sectional structure of the first protrusion in a plane perpendicular to a direction in which the first touch lead extends has a trapezoidal shape, the cross-sectional structure has a larger width at a side close to the substrate than another side facing away from the substrate, and the first touch lead is arranged correspondingly to a top side of the first protrusion and between adjacent first protrusions.

8. The display device according to claim 1, wherein a second protrusion is arranged on the first protrusion, the first protrusion and the second protrusion are stacked, and a projection of the second protrusion onto the substrate is within a projection of the first protrusion onto the substrate.

9. The display device according to claim 1, wherein the second touch metal layer comprises a first touch electrode block, and the first touch lead is electrically connected to the first touch electrode block; a fourth protrusion is further arranged correspondingly to a connection line between the first touch electrode block and the first touch lead.

10. The display device according to claim 9, wherein a side of the fourth protrusion close to the first area coincides with the first area, and the fourth protrusion is connected to the first protrusion.

11. The display device according to claim 1, further comprising a second dam, wherein the second dam is farther from the first area than the first dam.

12. The display device according to claim 11, further comprising a second touch lead and a touch pin, wherein the second touch lead is electrically connected to the touch pin; corresponding to an area where the second touch lead overlaps with the first dam and the second dam, the first dam comprises a seventh sub-layer, an eighth sub-layer, and a ninth sub-layer, and the second dam comprises a tenth sub-layer and an eleventh sub-layer; and the seventh sub-layer of the first dam is connected to the tenth sub-layer of the second dam.

13. The display device according to claim 12, wherein a side of the seventh sub-layer of the first dam close to the first area overlaps with the first area.

14. The display device according to claim 12, wherein a height of the second dam is lower than a height of the first dam, corresponding to the area where the second touch lead overlaps with the first dam and the second dam.

15. The display device according to claim 12, wherein a projection of the seventh sub-layer onto the substrate covers a projection of the eighth sub-layer onto the substrate in an area where the second touch lead overlaps with the first dam.

16. The display device according to claim 12, wherein corresponding to the area where the second touch lead overlaps with the first dam and the second dam, the second dam further comprises a twelfth sub-layer; the eighth sub-layer of the first dam is connected to the eleventh sub-layer of the second dam; and the ninth sub-layer of the first dam is connected to the twelfth sub-layer of the second dam.

* * * * *